United States Patent [19]
Ferland et al.

[11] Patent Number: 5,883,523
[45] Date of Patent: Mar. 16, 1999

[54] COHERENT SWITCHING POWER FOR AN ANALOG CIRCUIT TESTER

[75] Inventors: Michael R. Ferland, Tualatin, Oreg.; Jeffrey D. Currin, Pleasanton, Calif.

[73] Assignee: Credence Systems Corporation, Fremont, Calif.

[21] Appl. No.: 846,384

[22] Filed: Apr. 29, 1997

[51] Int. Cl.[6] ............................................. G01R 31/26
[52] U.S. Cl. .................................... 324/765; 324/537
[58] Field of Search .......................... 324/765, 158.1, 324/537

[56] References Cited

U.S. PATENT DOCUMENTS 4,290,313  9/1981  Appel et al. ..................... 73/861.17

OTHER PUBLICATIONS

Horowitz, Paul and Hill, Winfield, *The Art of Electronics, 2nd Edition,* Cambridge University Press, 1989, pp. 360–368 (Month Unavailable).

*Primary Examiner*—Josie Ballato
*Assistant Examiner*—Russell M. Kobert
*Attorney, Agent, or Firm*—Smith-Hill and Bedell

[57] ABSTRACT

A circuit tester stimulates an analog circuit device under test (DUT) with a test signal and periodically digitizes a resulting DUT output signal to produce an output data sequence that may be analyzed to ascertain DUT operating characteristics. The tester is powered by a switching power supply that induces periodic noise spikes in the DUT output signal. To eliminate the influence of the noise spikes on test results, the period of the switching power supply noise is made coherent with the digitization period. The phase of digitization is then adjusted so that the tester avoids digitizing the noise spikes in the DUT output signal.

13 Claims, 2 Drawing Sheets

COHERENT SWITCHING POWER FOR AN ANALOG CIRCUIT TESTER

BACKGROUND OF THE INVENTION

1. Field of the Invention

The present invention relates in general to analog circuit testers and in particular to a system for minimizing effects of switching power supply noise in an analog circuit tester.

2. Description of Related Art

A typical analog circuit tester includes a waveform generator for sending an analog test signal to an input of an analog device under test (DUT) and digitizer for digitizing an output signal produced by the DUT in response to the test signal. For example a tester may send a sequence of sine wave test signals of various frequencies to a DUT input and then digitize the DUT output signal to produce a data sequence representing the time varying behavior of the DUT output signal. The data sequence can then be analyzed using well-known digital signal processing techniques to determine such DUT characteristics as frequency response, signal-to-noise ratio, distortion and the like.

Noise generated by the analog circuit tester itself can influence test results. Tester-generated noise can enter the DUT as a component of the test signal or through air in the form of electromagnetic inductance and reappear as a component of the DUT output signal being digitized. The noise from the tester will then appear as a component of the digital output data sequence produced by the tester and will make such measured DUT parameters as signal-to-noise ratio and distortion look worse than they really are since a portion of the output signal noise is caused by the tester and not by the DUT.

Analog circuit testers typically employ line-powered switching power supplies because they can supply large amounts of power while being relatively small and efficient. A typical switching power supply is described at pages 360–368 of THE ART OF ELECTRONICS, second edition, a book by Paul Horowitz and Winfield Hill, published in the United States of America in 1989 by Cambridge University Press. Such a switching power supply rectifies an AC signal to produce a DC signal, pulse-width modulates a DC signal and then applies the pulse-width modulated DC signal to the primary of a transformer. The signal appearing at the transformer secondary is then rectified and filtered to produce the output power signal.

One problem with using a switching power supply is that it is a major source of noise, the act of pulse width modulating DC signal being a very noisy activity. Power supply noise is an obstacle to increasing the accuracy of analog circuit testing. The noise generated by a switching power supply can be reduced by filtering the output power signal and by shielding the power supply. But filtering and shielding does not completely eliminate noise. What is needed is a system for eliminating the effects of noise from a switching power supply on the measurements performed by an analog circuit tester employing such a power supply.

SUMMARY OF THE INVENTION

An analog circuit tester tests an analog circuit device under test (DUT) by transmitting a test signal to the DUT and digitizing an output signal produced by the DUT to produce a data sequence that can be analyzed to determine characteristics of the DUT. The tester supplies a common reference clock signal to a waveform synthesizer producing the test signal and to a digitizer sampling the DUT output. The waveform synthesizer uses the clock signal as a time base reference when generating the test signal, and the digitizer uses the reference clock signal as a reference for controlling the timing of the DUT output signal sampling. The tester also employs a line-powered switching power supply as a power source for the waveform synthesizer and the digitizer. The switching power supply pulse-width modulates a DC signal and then applies the pulse-width modulated DC signal to the primary of a transformer. The signal appearing at the transformer secondary is then rectified and filtered to produce the output power signal. A pulse-width modulator circuit controls the voltage level of the output power signal by adjusting the pulse-width of the modulated DC signal so that the voltage of the output power signal matches a reference voltage.

In accordance with one aspect of the invention, the pulse-width modulator circuit in the switching power supply uses the system reference clock signal as timing reference for its pulse-width modulation. In doing so, noise spikes produced by the switching power supply are made coherent with the reference clock signal, appearing with a period that is an integer multiple of the reference clock signal period.

The switching supply will generate two periodic noise spikes. A first noise spike results from the leading edge of each pulse of the pulse-width modulated DC signal. Since this noise spike is coherent with the reference clock signal, the noise spike will occur at the same relative time during a current reference clock signal cycle. The first noise spike will not occur during every reference clock cycle, but whenever it does occur, it occurs at the same relative time with respect to the current reference clock cycle. The second noise spike results from the trailing edge of the pulse-width modulated DC signal and will have the same frequency as the first noise spike. Thus trailing edge spikes will also occur at consistent times with respect to reference clock signal cycles.

With noise spikes from the switching power supply made coherent with the reference clock signal controlling sampling of the DUT output signal, the effects of that noise on the digitizer output data is eliminated using either of two methods in accordance with the present invention. A first method for eliminating the effects of the noise spikes is to adjust the timing of sampling of the DUT output signal so that the digitizer avoids sampling the noise spikes. This is easy to do because the noise spikes, being coherent with the reference clock signal controlling sample timing, occur at predictable times relative to the reference clock period. In accordance with a second method for eliminating the effects of the noise spikes, the DUT output signal is digitized without regard to the noise spikes. Here effects of the noise spikes appear in the digitized data, but are thereafter removed by digital filtering. The effects of the noise spikes can be removed because, being coherent with the reference clock signal, the noise is identifiable as a subharmonic of the reference clock frequency. Since the power supply related noise has identifiable frequency components, the effects of that noise can be easily removed from the data using any of several well known digital filtering techniques.

Thus both methods rely on noise from the switching power supply being made coherent with the tester clock signal. In the first method the noise is prevented from influencing the DUT output data by restricting the timing of samples to avoid the noise spikes. In the second method the noise is allowed to enter into the sample data but is removed thereafter by digital filtering.

It is accordingly an object of the invention to provide means for eliminating the effects on test results of noise spikes produced by a switching power supply within an analog circuit tester.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 1 is a block diagram of an analog circuit tester in accordance with the present invention, FIG. 2 is a block diagram of the switching power supply of FIG. 1, FIG. 3 is a timing diagram illustrating how a prior art tester samples an output signal from a device under test containing noise from the tester's switching supply, and FIG. 4 is a timing diagram illustrating how the tester of FIG. 1 samples an output signal of a device under test containing noise from the tester's switching power supply.

DESCRIPTION OF THE PREFERRED EMBODIMENT(S)

Figure 1:
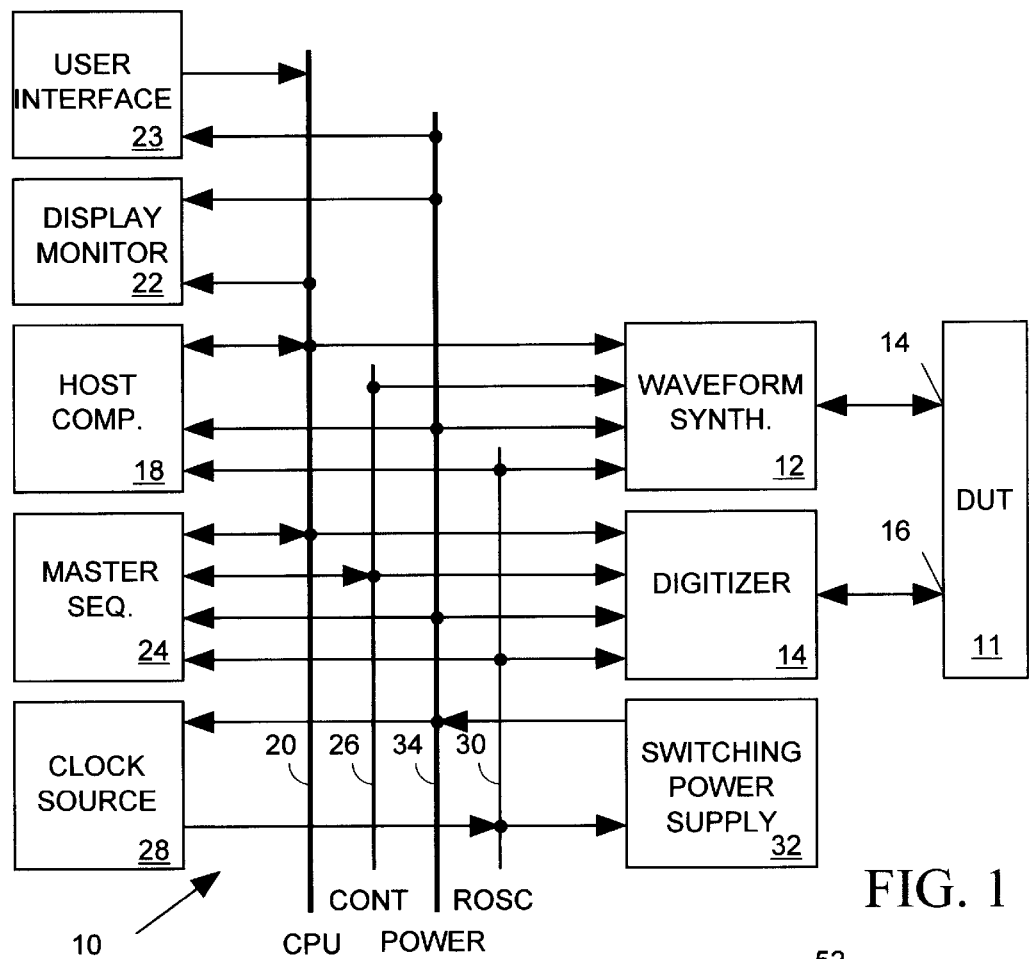

FIG. 1 depicts a tester 10 in accordance with the present invention. Tester 10 includes a waveform synthesizer 12 for generating and transmitting a test signal to an input of a device under test (DUT) 11 and a digitizer 14 for digitizing an output signal produced at DUT output terminal 16 in response to the input signal. Digitizer 14 stores acquired data representing the DUT output signal in an internal memory accessed by a host computer 18 via a conventional CPU bus 20. Host computer 18 may be programmed to analyze the digitized waveform data produced by digitizer 14 to determine various operating characteristics of DUT 11, such as for example frequency response, signal-to-noise ratio, distortion and the like, and to display the results of its analysis on a display monitor 22. The host computer 18 can also generate a display of the digitized DUT output waveform on display monitor 22. Programs for analyzing digitized waveform data and for generating displays of waveforms and results are well-known and not detailed herein.

A test may, for example, be defined by a user supplying data to host computer 18 via a user interface 23 connected to host computer 18 via CPU bus 20. The user interface 23 may include, for example, a keyboard, a mouse, control knobs etc. A user may define a test spanning several test cycles wherein synthesizer 12 sends a user-define test waveform to the DUT during each test cycle and wherein digitizer 14 digitizes the waveform at some user-defined sampling frequency and phase during each test cycle. After receiving the user input, host computer 18 transmits control data via CPU bus 20 to waveform synthesizer 12 indicating for each test cycle, the nature of a test signal synthesizer 12 is to produce, including its shape, frequency and amplitude. Host computer 18 also sends control data via CPU bus 20 to digitizer 14 indicating how digitizer 14 is to digitize the DUT output signal during each test cycle, including sampling frequency and phase. The host computer 18 also sends a sequence of instructions to a master sequencer 24 via CPU bus 20 indicating the duration of each test cycle. Sequencer 24 controls waveform synthesizer 12 and digitizer 14 during the test via signals sent over a control bus 26.

Having loaded the instructions into waveform synthesizer 12, digitizer 14 and sequencer 24, the host computer 18 sends a START command to sequencer 24 via CPU bus 20. Sequencer 24 then begins a first cycle of the test by signaling waveform synthesizer 12 to begin supplying the first test signal waveform to DUT 11 and signaling digitizer 14 to begin sampling that DUT output signal in the appropriate manner. After a time indicated by its first instruction, master sequencer 24 begins the second cycle of the test by signaling the waveform synthesizer to begin transmitting the second waveform to DUT 11 and signals the digitizer 14 to begin digitizing the DUT output signal in the manner indicted for the second cycle. This process is repeated for each cycle of the test. When the test is complete, master sequencer 24 signals host computer 18 via CPU bus 20. Host computer 18 then acquires via bus 20 the digital data stored in digitizer 14 and processes it to determine operating characteristics of DUT 11.

An oscillator within a centralized clock source 28 produces a reference clock signal ROSC and a clock bus 30 conveys the ROSC signal to waveform synthesizer 12, digitizer 14, host computer 18 and master sequencer 24. All of these circuits use the ROSC clock signal as a master timing reference. The master sequencer 26 is clocked by the ROSC signal and determines the length of each test cycle by counting ROSC clock signal cycles. Host computer 18 is also clocked by the ROSC clock. The waveform synthesizer 12 uses the ROSC clock signal as a timing reference when establishing the frequency of the test signal it produces. Digitizer 14 uses the ROSC signal as a reference when establishing its sampling frequency and phase. In particular digitizer 14 samples the DUT 11 output signal N nanoseconds after every Mth ROSC signal pulse, where N and M are adjustable, with M being an integer. Although the sampling frequency and phase employed by digitizer 14 are adjustable, sampling will always be coherent with ROSC signal because the sampling period will always be an integer multiple of the ROSC clock signal period.

All of the above-mentioned components of tester 10 including their programming, interaction and operation as described above are conventional and well known to those skilled in the art, and are not further detailed herein. The present invention is an improvement to a conventional analog circuit tester which minimizes effects of noise from the tester's power supply on the test results.

Analog circuit testers typically employ switching power supplies and much of the noise produced by an analog circuit tester arises from its switching power supply. Switching power supplies are well-known to those skilled in the art and widely used. A typical switching power supply is described at pages 360–368 of THE ART OF ELECTRONICS, second edition, a book by Paul Horowitz and Winfield Hill, published in the United States of America in 1989 by Cambridge University Press, and incorporated herein by reference. Switching power supplies are popular because, though relatively small in size, they are able to deliver relatively large amounts of power at various voltages with high efficiency. Their major drawback is noise; they are very noisy. When used to supply power to an analog circuit tester, the noise they produce can migrate into the DUT output signal. When this noise appears in the digitizer output data it can influence the host computer's characterization of the DUT based on analysis of that data.

Like many prior art analog circuit testers, tester 10 employs a line-powered switching power supply 32 which transmits power via a power bus 34 to all other components of tester 10. Like all switching power supplies, supply 32 is also very noisy. It is possible to reduce switching power supply noise by shielding and filtering, but it is difficult or impossible to eliminate it. The present invention does not seek to reduce power supply noise in an analog tester or to prevent it from migrating into the DUT output signal, but nonetheless mitigates its effects on tester results. To understand how the invention achieves this, it is necessary to understand how switching power supplies work and why they make noise.

Figure 2:
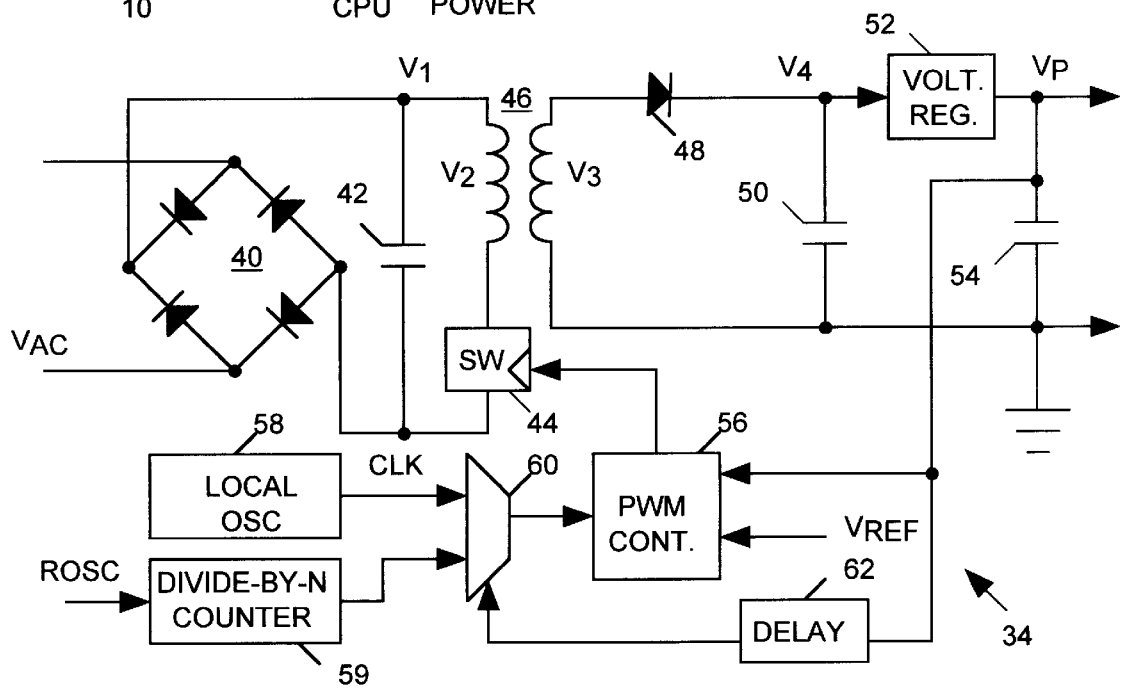

FIG. 2 illustrates switching power supply 34 of FIG. 1 in simplified block and schematic diagram form. It is a modified version of a switching power supply described in more detail in the above-mentioned book by Horowitz et al. Referring to FIG. 2, a full wave rectifier 40 rectifies an AC line voltage $V_{AC}$ to produce a rectified DC voltage $V_1$ across a capacitor 42. A switch 44 (suitably a MOSFET transistor) pulse-width modulates $V_1$ to produce a square wave voltage $V_2$ across primary terminals of a transformer 46. A rectifying diode 48 rectifies the voltage $V_3$ appearing across the secondary terminals of transformer 46 to produce a DC voltage $V_4$ across a capacitor 50. A voltage regulator 52 regulates $V_4$ to produce the output power signal $V_P$ across a second capacitor 54. A pulse-width modulation control circuit 56 controlling switch 44 compares the voltage level of the output power signal $V_P$ to a reference voltage $V_{REF}$. When $V_P$ is lower than $V_{REF}$, control circuit 56 increases the relative amount of time switch 44 stays on during each on/off cycle. This results in an increase in the voltage of $V_P$. When $V_P$ is higher than $V_{REF}$, control circuit 56 decreases the relative amount of time switch 44 stays on during each on/off cycle to decrease the voltage of $V_P$. Thus the feedback provided by pulse width modulation circuit 56 holds the output power signal $V_P$ to $V_{REF}$.

Although the simplified power supply shown in FIG. 2 produces only one output signal V, tester 10 may require power signals of several different voltages. However it will be understood by those skilled in the art that power supply 34 of FIG. 2 can be adapted to produce more than one output voltage by providing several appropriately sized secondary windings on transformer 46 and separately rectifying and regulating the output of each secondary winding to produce the various output voltage levels.

The pulse-width modulation control circuit 56 of FIG. 2 uses an input clock signal as a reference for timing the duty cycle of switch 44. At system startup a local oscillator 58 produces an output clock signal CLK supplied as the timing reference to pulse-width modulation control circuit 56 via a multiplexer 50. Switching power supplies employed by prior art analog circuit testers use the output clock signal of a local oscillator as a timing reference during analog circuit tests. However, in accordance with the present invention, after system start up, when clock source 30 of FIG. 1 has had time to receive power from power supply 34 and to begin generating its output clock signal ROSC, a time delay circuit 62 switches multiplexer 60 in delayed response to $V_P$. Multiplexer 60 now begins to supply the ROSC clock signal, frequency divided by a divide-by-N counter 59, as the timing reference to pulse-width modulation control circuit 56 and continues to do so until the tester is turned off.

At steady state, when $V_P=V_{REF}$, the pulse width modulation circuit 56 periodically turns switch 44 on for a certain number X of ROSC signal cycles and then turns switch 44 off for a certain number Y of cycles. X and Y remain fixed for as long as the tester operates. The duty cycle of $V_2$ is thus X/(X+Y). Note that $V_2$ will be coherent with the ROSC signal. That is, the leading and trailing edges of each pulse of $V_2$ will always occur at the same times relative to cycles of the ROSC signal in which they occur. In other words, if the leading (or trailing) edge of a $V_2$ signal pulse occurs 1 nsec after the leading edge of a ROSC signal pulse, then the leading (or trailing) edges of all $V_2$ signal pulses will occur 1 nsec after the leading edge of a ROSC signal pulse.

A switching power supply such as that illustrated in FIG. 2 is inherently noisy because a pulse-width modulated DC signal ($V_2$) is inherently noisy. Nature abhors abrupt voltage changes and registers its complaint loudly in the form of high amplitude, transient noise spikes in the modulated signal. The spikes, coinciding with leading and trailing edges of the pulse width modulated signal $V_2$, are relatively narrow; switching power supply noise is quite low at other times during the switching cycle. In a prior art tester employing a local oscillator as a timing reference for pulse-width modulation when testing the DUT, the noise spikes produced by the switching power supply are not coherent with the tester reference clock signal. They do not occur at consistent times relative to cycles of the tester's reference clock signal. Thus although we can adjust the phase of DUT output signal sampling relative to the system reference clock, there is no way to predict whether the digitizer will sample a power supply noise spike appearing in the DUT output signal.

In contrast, since the switching power supply 34 of FIG. 2 uses the ROSC clock as a modulation timing reference, noise spikes produced by the switching power supply are coherent with the ROSC signal. If we know when one spike occurs relative to a ROSC signal cycle, we can predict that all subsequent noise spikes will occur at the same relative time during subsequent ROSC signal cycles. Thus the main difference between the switching power supply 34 of FIG. 2 and the switching power supplies of prior art testers is that the noise produced by supply 34 is coherent with the tester's master timing clock ROSC whereas the noise produced by the switching power supplies of prior art testers is not. This means that while the relative timing of noise spikes produced by supply 34 is predictable, relative timing of noise spikes produced by prior art switching power supplies are not. The advantage of making power supply noise coherent and predictable will become clear from the discussion to follow.

Figure 3:
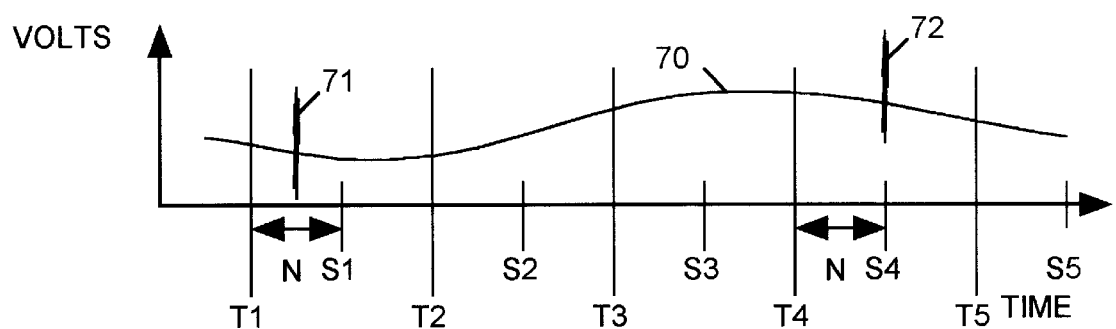

FIG. 3 is a timing diagramming illustrating how power supply noise spikes can affect digitizer measurements of a DUT output signal 70 when power supply noise is not coherent with the reference clock controlling sample timing. FIG. 3 illustrates two such noise spikes 71 and 72. In this example, leading edges of successive pulses of the system reference clock occur at times T1–T5. The digitizer is programmed to sample the DUT output signal 70 at times S1–S5, each occurring N nanoseconds after a system reference clock pulse. During this sampling period two noise spikes 71 and 72 appear in the DUT output signal 70. Since the noise spikes 71 and 72 are not coherent with the digitizer's reference clock, they occur at different times relative to the reference clock cycle during which they occur. Since spike 72 happened to occur at sampling time S4, the noise spike affects the digitizer output data. Since the noise spikes result from the tester and not from the device under test, the digitizer output data unfairly represents the DUT performance. The amount of noise that makes its way into the digitizer's acquired data is to some extent dependent on when the samples are taken. For example, for some values of sampling delay N neither spike 71 or spike 72 are sampled. However, since the noise spikes are not coherent with the digitizer's clock, it is not possible to predict when the noise spikes will occur relative to the sample timing. Thus it is not possible to adjust the sampling phase (by adjusting sampling delay N) to avoid sampling a noise spike with certainty.

In accordance with the present invention, where multiplexer 60 of FIG. 2 delivers the frequency divided ROSC signal to pulse width modulation control circuit 56, the power supply noise spikes are coherent with the ROSC signal, having a period that is an integer multiple of the period of the ROSC clock signal. While noise spikes will not occur during every cycle of the ROSC clock signal, whenever a noise spike does occur, it will always occur at one particular time relative to the start of a ROSC clock cycle. Depending on how pulse width modulation circuit 56 operates, noise spikes coinciding with leading edges of the $V_2$ signal may or may not appear at the same relative time during a ROSC clock cycles as the trailing edge noise spike, but both types of spikes will be periodic and coherent. For purposes of discussion herein below it will be assumed that leading and trailing edge noise spikes have the same timing relative to the start of a ROSC clock cycle.

Figure 4:
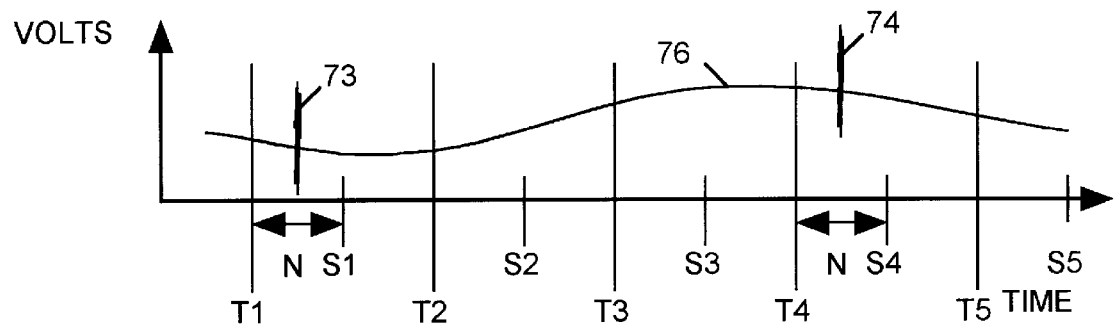

FIG. 4 is a timing diagramming illustrating the relationship between sample timing and power supply successive noise spikes 73 and 74 which are coherent with the digitizer reference clock ROSC when digitizing a DUT output signal 76. Since noise spikes 73 and 74 are coherent with the ROSC signal, they occur at the same time relative to the starts (T1 and T4) of the ROSC signal cycles in which they occur. Thus if we can determine when any one noise spike occurs during a ROSC signal cycle, we will know when all spikes will occur, and we can choose a sampling phase (by adjusting the sampling delay N) that will insure that digitizer 14 of FIG. 1 will avoid sampling a spike, no matter how long the sampling process continues. If digitizer 14 does not sample any power supply induced noise spikes, then the effects of power supply noise are substantially eliminated from the digitizer's output data characterizing the digitizer output signal even though the noise is not actually eliminated from the DUT output signal itself.

The phase of the power supply noise spikes 73 and 74 within DUT output signal 76 relative to the ROSC clock cycle is dependent on many factors. The noise can radiate through ground or air to the DUT or can pass to the DUT through the test waveform produced by the waveform synthesizer. The signal propagation rate of the DUT can also affect noise phase. Since noise can reach the DUT signal by different routes, a noise spike originating in the power supply may appear more than once in the DUT output signal. Nonetheless, all power supply noise spikes appearing in the DUT output signal will be coherent with the ROSC signal.

To avoid sampling any of these coherent noise spikes the sampling phase has to be properly adjusted for each device to be tested and for each sampling rate to be employed in the test. However, once the sampling phase is adjusted for a particular type of DUT 11, similar types of DUTs can be tested using the same sampling phase adjustment. A simple way to adjust the sampling phase is by trial and error. With waveform synthesizer 12 programmed to produce a low frequency sine wave test signal, and with the digitizer 14 set to sample at a desired sampling rate, tester 10 digitizes the DUT output signal and displays the results. If the waveform includes noise spikes appearing at periods that are regular multiples of the period of the system reference clock ROSC, then a user viewing the waveform display knows that noise emanating from the tester is being sampled. In such case the user instructs host computer 18 to change the digitizer's sampling phase. Tester 10 then repeats the test digitizing the DUT output signal and displaying the result. The process is repeated until the user does not see any tester-generated noise spikes in the displayed waveform. At that point the sampling phase is properly adjusted. The user can then command tester 10 to perform tests using any desired set of test signal waveforms, and as long as the user does not alter the sampling phase, the user can be assured that digitizer 14 will not sample noise spikes.

A variation on this method of adjusting the sampling phase does not require user intervention. After digitizing the DUT output signal produced in response to a sine wave DUT input signal, host computer 14 converts the digitizer output sequence to the frequency domain using the well-known discrete Fourier transform method. The resulting data sequence indicates the frequency components of the DUT output signal. Power supply noise appears in the frequency domain sequence as a subharmonic of the ROSC clock signal. By repeating the process several times using various sampling phases, the host computer 18 can determine a sampling phase yielding the lowest apparent noise, and then can use that sampling phase during subsequent DUT tests.

The above-described sample phase adjustment methods can always be employed to remove effects of power supply noise from the sample data, and are particularly suitable when the DUT output signal is of a high frequency. Another method for eliminating effects of coherent power supply noise can be used for low frequency DUT output signals. In accordance with this method, the sampling phase is set without regard to the timing of power supply related noise spikes. Although the resulting digitizer output data may be affected by the noise spikes, the noise spikes will be coherent with the ROSC clock. In such case host computer 18 can easily process the digitizer output data to remove the effects of the noise spikes using any of many well-known digital filtering techniques. For example, one way to do so is to first use a discrete Fourier transform function to convert the digitizer output sequence to the frequency domain. The magnitude of any element of the frequency domain sequence representing a subharmonic of the ROSC clock signal frequency is then set to zero. Thereafter the modified frequency domain sequence is transformed back to the time domain. A time domain sequence generated in this fashion will be a representation of the DUT output signal that would have been produced if the power supply had been free of noise spikes. Thus host computer 18 may act as a digital filter to remove subharmonics of the ROSC clock signal frequency from the digitizer 14 output data. Algorithms and computer programs implementing such digital filters are well known, and are therefore not further detailed herein.

Thus has been described an analog circuit tester 10 employing a switching power supply 32 which induces noise into signals produced by an analog DUT 11 but which substantially removes the effects of that noise from test results. The tester does this by constraining the power supply noise to frequencies that are coherent with the tester's digitizing frequency and then either by adjusting the sampling phase to avoid sampling power supply noise or by digitally filtering the coherent noise from the digitized output data.

While the foregoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A circuit tester comprising:

first means for stimulating an analog circuit device under test (DUT) with an electrical test signal such that said analog circuit device produces a DUT output signal in response to said test signal;

second means for periodically digitizing said DUT output signal to produce an output sequence of digital data values that may be analyzed to ascertain DUT operating characteristics, wherein each of said data values represents an instantaneous magnitude of said DUT output signal; and third means for supplying direct current power to at least one of said first and second means, wherein said direct current power induces periodic noise in the DUT output signal, and wherein a period of a substantial portion of said noise is coherent with a period of said digitizing.

2. An apparatus for testing an analog circuit device under test (DUT) by transmitting an electrical test signal to the DUT and sampling an output signal produced by said DUT in response to said electrical test signal, the apparatus comprising:

first means for generating a periodic reference clock signal at a fixed frequency;

second means for generating a direct current power signal in response to said periodic reference clock signal, said direct current power signal containing periodic noise spikes occurring at a noise frequency that is coherent with said fixed frequency;

third means powered by said direct current power signal for generating and transmitting said electrical test signal to said DUT in response to said periodic reference clock signal; and fourth means for sampling said DUT output signal in response to said periodic reference clock signal at a sampling frequency that is coherent with said fixed frequency.

3. The apparatus in accordance with claim 2 wherein said second means is a switching power supply comprising:

controller means for generating a pulse-width modulated signal; and means receiving said pulse-width modulated signal and producing said direct current power signal, wherein a voltage of said direct current power signal is controlled by a duty cycle of said pulse width modulated signal, said controller means monitoring said direct current power signal and adjusting said duty cycle to maintain said direct current power signal at a particular voltage level.

4. The apparatus in accordance with claim 3 wherein said controller means receives said periodic reference clock signal and adjusts a frequency of said pulse-width modulated signal in response thereto.

5. The apparatus in accordance with claim 4 wherein the frequency of said pulse width modulated signal is coherent with the frequency of said periodic reference signal.

6. The apparatus in accordance with claim 2 wherein said third means receives said periodic reference clock signal and generates said electrical test signal in response to said periodic reference clock signal.

7. An apparatus for testing an analog circuit device under test (DUT), the apparatus comprising:

means for generating a periodic reference clock signal;

a switching power supply responsive to said periodic reference clock signal for producing an output direct current power signal having noise spikes occurring therein with a period that is coherent with said periodic reference clock signal;

a waveform synthesizer powered by said direct current power signal for generating an electrical test signal and for transmitting said electrical test signal to said DUT, wherein said DUT produces an output signal in response to said electrical test signal, wherein said noise spikes occurring in said direct current power signal induce periodic noise in the DUT output signal that is coherent with said periodic reference clock signal; and a digitizer responsive to said periodic reference clock signal for digitizing said DUT output signal at a frequency that is coherent with said periodic reference clock signal, thereby to produce an output digital data sequence representing amplitudes of said DUT output signal at a succession of discrete times.

8. The apparatus in accordance with claim 7 further comprising means for adjusting a phase of said digitizing of said DUT output signal relative to said periodic reference signal so that said digitizer does not digitize the periodic noise in said DUT output signal.

9. The apparatus in accordance with claim 7 further comprising means for digitally filtering said output digital data sequence to remove a component thereof having a period that is coherent with said periodic reference clock signal.

10. A method of operating an analog circuit tester of the type which tests an analog circuit device under test (DUT) by stimulating a DUT input terminal with an electrical test signal, digitizing a DUT output signal produced in response to said electrical test signal at a digitizing frequency and digitizing phase to produce a digital data sequence representing a time varying behavior of said DUT output signal, and then analyzing the output digital data sequence to ascertain operating characteristics of the DUT, wherein the tester includes a direct current power supply that induces periodic noise spikes in the DUT output signal, comprising the step of controlling a frequency of said noise spikes so that it is coherent with said digitizing frequency.

11. The method in accordance with claim 10 further comprising the step of adjusting said digitizing phase so that said digitizer does not digitize said DUT output signal during said noise spikes.

12. The method in accordance with claim 10 further comprising the step of digitally filtering said output digital data sequence to remove effects of said noise spikes from said output data sequence before analyzing said output digital data sequence.

13. The method in accordance with claim 12 wherein the step of digitally filtering said output digital data sequence comprises the substeps of:

converting said output digital data sequence to a second digital data sequence representing said DUT output signal in a frequency domain; and removing effects of said noise from said second digital data sequence.

* * * * *